United States Patent [19]

Sakashita et al.

[11] Patent Number: 4,894,564
[45] Date of Patent: Jan. 16, 1990

[54] PROGRAMMABLE LOGIC ARRAY WITH REDUCED PRODUCT TERM LINE VOLTAGE SWING TO SPEED OPERATION

[75] Inventors: Kazuhiro Sakashita; Takashi Ohya; Takeshi Hashizume, all of Hyogo, Japan

[73] Assignee: Mitsubishi Denki Kabushiki Kaisha, Tokyo, Japan

[21] Appl. No.: 254,231

[22] Filed: Oct. 6, 1988

[30] Foreign Application Priority Data

Oct. 23, 1987 [JP] Japan .................... 62-268914

[51] Int. Cl.$^4$ .................... H03K 17/04; H03K 19/177
[52] U.S. Cl. .................... 307/465; 307/443; 307/469; 307/481; 307/296.1
[58] Field of Search ............... 307/443, 465, 468–469, 307/481, 269, 296.1; 304/716

[56] References Cited

U.S. PATENT DOCUMENTS

| | | | |
|---|---|---|---|
| 4,467,439 | 8/1984 | Rhodes | 307/465 X |
| 4,831,285 | 5/1989 | Gaiser | 307/481 X |
| 4,833,646 | 5/1989 | Turner | 307/468 X |

FOREIGN PATENT DOCUMENTS 55-74242  6/1980  Japan .

OTHER PUBLICATIONS

Gray, "Ground Buffer Circuit for Read-Only Memory Array", *IBM T.D.B.*, vol. 24, No. 7A, Dec. 1981, pp. 3315–3316.

"Power Reduction Method for Static CMOS Programmable Logic Arrays (PLAS)" *IBM T.D.B.* vol. 30, No. 10, Mar. 1988, p. 247–248.

*Primary Examiner*—David Hudspeth
*Attorney, Agent, or Firm*—Lowe, Price, LeBlanc, Becker & Shur

[57] ABSTRACT

A programmable logic array comprises an OR circuit (67) and an AND circuit (68). A voltage lower than a power-supply voltage is applied to product term lines (57–60) from a power supply portion (69) in response to conduction of p channel transistors (31–34) by a clock signal to be precharged, and a voltage lower than the power-supply voltage is applied to output lines (54, 55) from a power supply portion (70) in response to conduction of p channel transistors (39, 40) by the clock signal. Therefore, applied voltages of the product term lines and the output lines are lowered, so that responsibility of circuit is improved, whereby a programmable logic array with a high speed operation is obtained.

6 Claims, 3 Drawing Sheets $V_{DD}$: POWER SUPPLY VOLTAGE $V_{TTH}$: THRESHOLD VOLTAGE OF THE N CHANNEL TRANSISTOR $V_{ITH}$: THRESHOLD VOLTAGE OF THE INVERTER

4,894,564

PROGRAMMABLE LOGIC ARRAY WITH REDUCED PRODUCT TERM LINE VOLTAGE SWING TO SPEED OPERATION

BACKGROUND OF THE INVENTION

1. Field of the Invention

The present invention relates generally to programmable logic arrays, and more particularly, a programmable logic array which outputs a logic signal previously programmed in synchronization with an external clock signal.

2. Description of the Prior Art

With the progress of ASIC (application specific IC) of a logic VLSI (very-large-scale integrated circuit), it is important to make use of a logic macro-cell in order to design the logic VLSI having a high performance and high density for a short time period. Therefore, it is considered that a programmable logic array is effective as an element for treating irregular logic as a macro-unit.

Since the programmable logic array has simple logical structure, i.e., two-stage logical structure comprising an OR (logical sum) circuit and an AND (logical product) circuit, the programmable logic array has the advantages that the logic design is easily made, the logic design can be automated, and the change of design is easily made by only changing a single mask. In addition, since the programmable logic array has structure suitable for an integrated circuit, integration density is easily increased. Furthermore, since the programmable logic array has regular structure, failures are easily tested.

FIG. 1 is an electric circuit diagram showing one example of a conventional programmable logic array.

Referring now to FIG. 1, description is made on the structure of the conventional programmable logic array. The programmable logic array includes an OR circuit 67 and an AND circuit 68. The OR circuit 67 comprises input signal lines 51 to 53 receiving signals applied to input terminals 2, 3 and 4, respectively, and inverted input signal lines 48 to 50 receiving signals obtained by inverting the signals by inverters 7 to 9, respectively. Product term lines 57 to 60 and ground lines 61 and 62 are provided perpendicularly intersecting with the input signal lines 51 to 53 and the inverted input signal lines 48 to 50. The ground lines 61 and 62 have their respective one ends connected to ground through n channel transistors 35 and 36, respectively. In addition, the product term lines 57 to 60 have their respective one ends connected to supply terminals 71 to 74 through p channel transistors 31 to 34, respectively. The n channel transistors 35 and 36 and the p channel transistors 31 to 34 have their gates connected to a clock input terminal 1 by a clock signal line 47. In addition, n channel transistors 66, 78 and 79 are connected to intersections of the inverted input signal lines 48 to 50 and the product term lines 57 to 60 and the ground lines 61 and 62 as required, to be programmed.

On the other hand, an output of the OR circuit 67 is transmitted to the AND circuit 68 through inverters 20 to 27 from the product term lines 57 to 60. Output lines 54 and 55 and a ground line 56 are provided perpendicularly intersecting with the product term lines 57 to 60. The ground line 56 has its one end connected to ground through an n channel transistor 41. In addition, the output lines 54 and 55 have their respective one ends connected to supply terminals 76 and 77 through p channel transistors 39 and 40, respectively. The output lines 54 and 55 have their respective other ends connected to latch circuits respectively comprising inverters 11 and 12 and 14 and 15 through inverters 16 to 19 and n channel transistors 43 and 45, and connected to output terminals 5 and 6 through inverters 10 and 13, respectively.

The n channel transistors 43 and 44 have their gates connected to a clock input terminal 1. In addition, the p channel transistors 39 and 40 and the n channel transistor 41 are opened or closed in response to a clock signal applied through a p channel transistor 37 and inverters 28 to 30. The p channel transistors 39 and 40 have their drains connected to the supply terminals 76 and 77, respectively. Furthermore, n channel transistors 80 and 81 are connected to respective intersections of the product term lines 57 to 60 and the output lines 54 and 55 and the ground line 56 in the AND circuit 68 as required, to be programmed.

Description is now made on an operation of the conventional programmable logic array shown in FIG. 1. Signals inputted from the input signal terminals 2 to 4 are transmitted to the input signal lines 51 to 53, respectively. In addition, the signals are inverted by the inverters 7 to 9, to be transmitted to the inverted signal input lines 48 to 50, respectively. When the clock signal is inputted to the clock input terminal 1 and the clock signal is at an "L" level, a clock gate comprising the p channel transistors 31 to 34 is opened. Consequently, voltages are applied to the product term lines 57 to 60 from the supply terminals 71 to 74, respectively, so that the product term lines 57 to 60 are precharged, to attain an "H" level.

Then, when the clock signal attains the "H" level, a clock gate comprising the n channel transistors 35 and 36 is opened. Consequently, only a transistor having its gate connected to the input signal line at the "H" level is rendered conductive, so that charges stored in any of the product term lines 57 to 60 are discharged, whereby any of the product term lines whose charges are discharged attains the "L" level. At that time, the n channel transistor 41 is also opened. Thus, in the AND circuit 8, charges are stored and discharged in the output signal lines 54 and 55, so that suitable output logic can be obtained.

However, in the conventional programmable logic array shown in FIG. 1, a power-supply voltage $V_{DD}$ is directly applied to the product term lines 57 to 60 and the output lines 54 and 55, so that a long time is required for discharging after the product term lines 57 to 60 and the output lines 54 and 55 are charged. This is one factor which prevents speeding up of the operation.

SUMMARY OF THE INVENTION

Therefore, an object of the present invention is to provide a programmable logic array operable at high speed by lowering applied voltages of product term lines and output lines to improve responsiveness of a circuit.

Briefly stated, according to the present invention, the programmable logic array is provided with logic circuit means comprising a plurality of input lines, a plurality of product term lines each provided intersecting with the input lines, and at least one output line provided intersecting with the plurality of product term lines for outputting a logical product signal by connecting transistors to intersections of the plurality of input lines and any of the plurality of product term lines as required to be programmed, as well as outputting a logical sum signal by connecting transistors to intersections of the plurality of product term lines and at least one output line to be programmed, which is adapted such that the plurality of product term lines and at least one output line are precharged to a potential lower than a power-supply potential from pull-up circuit means through clock gate means responsive to a clock signal to be rendered conductive.

Thus, according to the present invention, since voltages precharged on the product term lines and the output lines are made lower than the power-supply potential, the discharge time can be shortened and a cycle of the clock signal can be shortened, so that a programmable logic array with a high operating speed is obtained.

In a preferred embodiment of the present invention, there are provided clock gate means responsive to the clock signal for outputting a signal on the output line and further latch circuit means for storing an output of the clock gate means to output the same.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
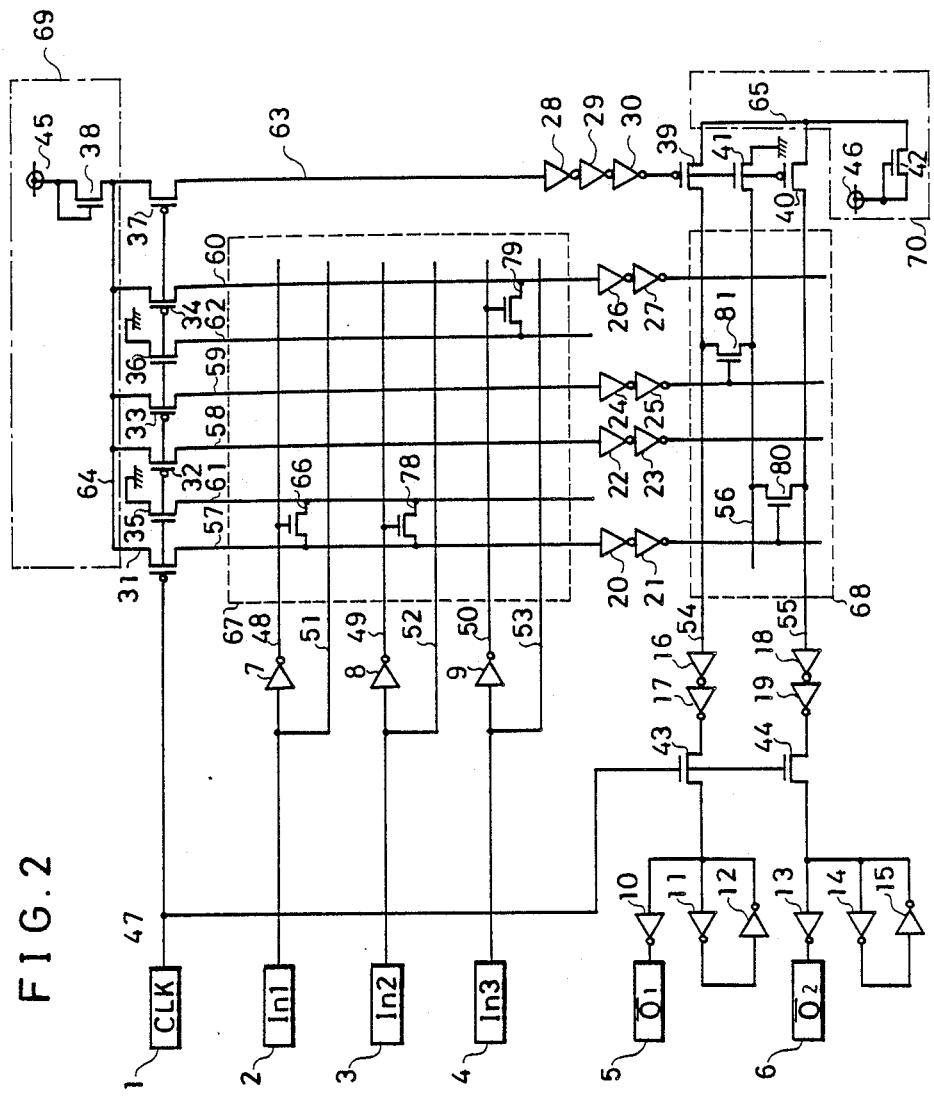
FIG. 2 is an electric circuit diagram according to an embodiment of the present invention.

FIG. 2 is a specific electric circuit diagram according to an embodiment of the present invention.

Figure 1:
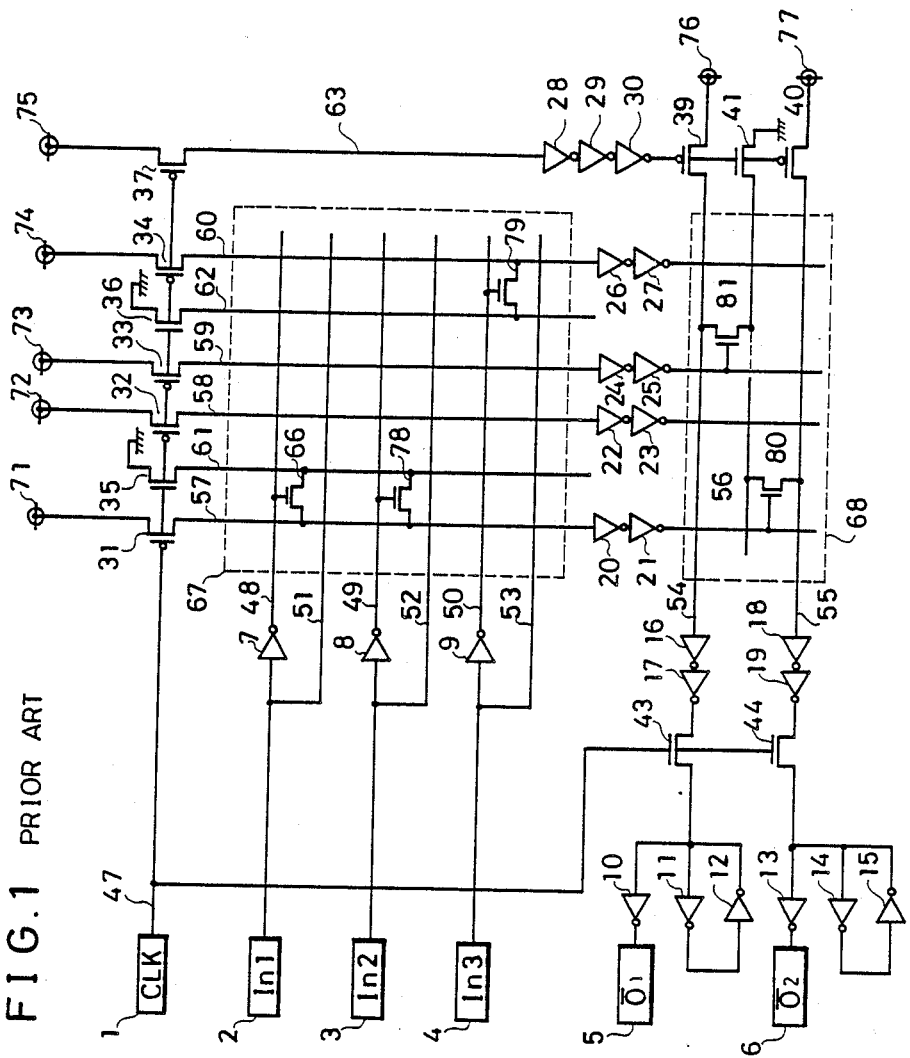
FIG. 1 is an electric circuit diagram of a conventional programmable logic array.

Referring now to FIG. 2, description is made on structure according to an embodiment of the present invention. In the embodiment shown in FIG. 2, power supply portions 69 and 70 are provided, in addition to the above described programmable logic array shown in FIG. 1. More specifically, the product term lines 57 to 60 have their respective one ends connected to respective sources of the p channel transistors 31 to 34 which operate in response to a clock signal. The p channel transistors 31 to 34 have their drains connected to a common power supply line 64. The power supply line 64 is connected to a source of an n channel transistor 38, and the n channel transistor 38 has its gate and drain connected to a power supply terminal 45, constituting the power supply portion 69.

Similarly, the output lines 54 and 55 in the AND circuit 68 have their respective one ends connected to sources of the p channel transistors 39 and 40 which operate in response to the clock signal. The p channel transistors 39 and 40 have their drains connected to a common power supply line 65. The power supply line 65 is connected to a source of an n channel transistor 42, and the n channel transistor 42 has its gate and drain connected to a power supply terminal 46, constituting the power supply portion 65. The other structure is the same as that of the above described programmable logic array shown in FIG. 1.

Figure 3:
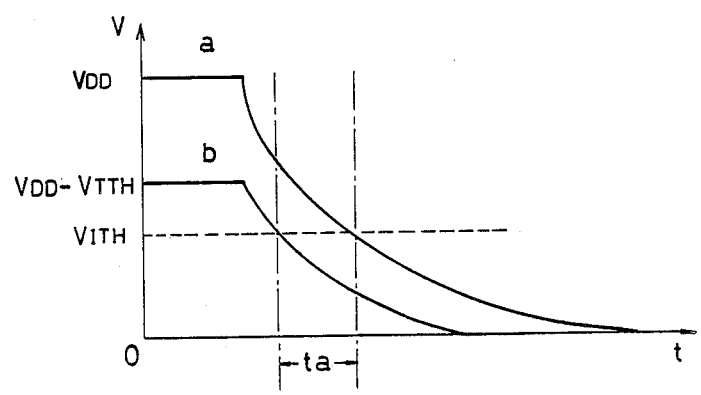
FIG. 3 is a diagram showing a waveform at the time of discharging of product term lines according to an embodiment of the present invention.

FIG. 3 is a diagram showing a waveform at the time of discharging of the product term lines in the programmable logic array shown in FIG. 2.

Description is now made on an operation of the programmable logic array according to an embodiment of the present invention shown in FIG. 2. The operation of the programmable logic array is the same as that in the conventional example shown in FIG. 1 and hence, actions of the power supply portions 69 and 70 are described. A power-supply voltage $V_{DD}$ drops, by a threshold value $V_{TTH}$ of the transistor, by the n channel transistors and 42 connected to the power supply terminals 45 and 46, so that a voltage of $V_{DD}-V_{TTH})$ is applied to the product term lines 57 to 60, which is described with reference to FIG. 3. When charges stored in the product term lines 57 to 60 are discharged, voltages on the product term lines 57 to 60, i.e., voltages applied to the inverters 20 to 27 indicate such response characteristics that the applied voltage at the time of charging is $V_{DD}-V_{TTH})$ as represented by a curve b, as compared with $V_{DD}$ in the conventional example as represented by a curve a, based on the difference in voltage before discharging.

The discharge time elapsed until a threshold voltage $V_{ITH}$ of the inverters 20 to 27 is reached when the applied voltage of the product term lines 57 to 60 is $(V_{DD}-V_{TTH})$ is earlier, by ta, as compared with when the applied voltage is $V_{DD}$, so that the response characteristic is improved. Correspondingly, the clock frequency can be made high.

A power-supply voltage $V_{DD}$ is lowered by $V_{TTH}$ by the n channel transistors 38 and 42. However, if the n channel transistors 38 and 42 are not discharged for a long time, a source voltage gradually increases from $V_{DD}-V_{TTH})$ to $V_{DD}$ There is no problem when charging and discharging of the product term lines 57 to 60 are always repeated in response to the clock signal. When electrical connection from the product term lines 57 to 60 to the ground lines 61 and 62 is not made so that discharging does not occur, the applied voltages of the product term lines 57 to 60 gradually rise to $V_{DD}$. However, if the p channel transistors 31 to 34 serving as clock gates corresponding to the product term lines 57 to 60 are connected to a common power supply, the product term lines 57 to 60 are all charged at equal voltages.

Meanwhile, an operation of the power supply portion 70 on the output lines 54 and 55 in the AND circuit 68 is the same as described above. In addition, the inverters 16 to 19 connected to the output lines 54 and 55 raise a voltage which is lowered to $(V_{DD}-VV_{TTH})$, so that the voltage is easily held in latch circuits respectively comprising the inverters 11 and 12 and 14 and 15.

As described in the foregoing, according to the embodiment of the present invention, since the voltages applied to the product term lines 57 to 60 and the output lines 54 and 55 are reduced to shorten the discharge line, a cycle of the clock signal can be shortened. Therefore, a disadvantage of the conventional programmable logic array, i.e., show response can be significantly improved, so that a programmable logic array with a fast operating speed can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A programmable logic array for outputting a logic signal previously programmed in synchronization with a clock signal, comprising:

logic circuit means (67, 68) comprising a plurality of input lines (48-53), a plurality of product term lines (57-60) each provided intersecting with said input lines, and at least one output line (54, 55) provided intersecting with said plurality of product term lines for outputting a logical product signal by connecting transistors (66, 78, 79) to intersections of said plurality of input lines and any of said plurality of product term lines as required, to be programmed, as well as outputting an logical sum signal by connecting transistors (80, 81) to intersections of said plurality of product term lines and at least one output line, to be programmed, clock gate means (31-34, 39, 40) connected to said plurality of product term lines and said at least one output line, respectively, and responsive to said clock signal to be rendered conductive, and pull-up circuit means (38, 42) comprising first and second conduction terminals and a gate electrode, said first conduction terminal and said gate electrode being connected to power supply terminals (45, 46) and the second conduction terminal being connected to said clock gate means, said pull-up circuit means being responsive to conduction of said clock gate means for precharging said plurality of product term lines and said at least one output line to a potential lower than the power-supply potential.

2. The programmable logic array according to claim 1, wherein said logic circuit means comprises logical product circuit means (67) comprising first ground lines (61, 62) provided in parallel with each of said product term lines and intersecting with each of said input lines, said transistors being connected to intersections of each of said input lines and each of said product term lines and said first ground line as required, to be programmed, and logical sum circuit means (68) comprising a second ground line (56) provided in parallel with said output line, said transistors being connected to intersections of each of said product term lines and said output line and said second ground line as required, to be programmed.

3. The programmable logic array according to claim 2, wherein said clock gate means comprises first clock gate means (31-34) each provided corresponding to each of said product term lines and comprising first and second conduction terminals and a gate electrode, the first conduction terminals being connected together to said pull-up circuit means and said second conduction terminals being connected to corresponding product term lines, said first clock gate means being responsive to application of a clock signal of a first level to the gate electrodes for precharging corresponding product term lines, respectively, second clock gate means (35, 36) each provided corresponding to each of said first ground lines and comprising first and second conduction terminals and a gate electrode, said first conduction terminals being connected to one end of said first ground line and said second conduction terminals being grounded, said second clock gate means being responsive to application of a clock signal of a second level to said gate electrodes for grounding said first ground lines, respectively, third clock gate means (39, 40) each provided corresponding said output line and comprising first and second conduction terminals and a gate electrode, said first conduction terminals being connected to said pull-up circuit means and said second conduction terminals being connected to one end of said output line, said third clock gate means being responsive to application of said clock signal of the first level to the gate electrodes for precharging said output line, and fourth clock gate means (41) comprising first and second conduction terminals and a gate electrode, said first conduction terminal being connected to one end of said second ground line and said second conduction terminal being grounded, said fourth clock gate means being responsive to input of said clock signal of the second level to said gate electrode for grounding said second ground line.

4. The programmable logic array according to claim 3, wherein said pull-up circuit means comprises a first transistor (38) comprising first and second conduction terminals and a gate electrode, said first conduction terminal and said gate electrode being connected to a power supply terminal (45) and said second conduction terminal being connected to first conduction terminals connected together of said first clock gate means, and a second transistor (42) comprising first and second conduction terminals and a gate electrode, said first conduction terminal and said gate electrode being connected to a power supply terminal (46) and said second conduction terminal being connected to first conduction terminals of said third clock gate means.

5. The programmable logic array according to claim 4, which further comprises fifth clock gate means (43, 44) connected to the other end of said output line and responsive to said clock signal for outputting a signal on said output line.

6. The programmable logic array according to claim 5, further comprising latch circuit means (11, 12, 14, 15) for storing an output of said fifth clock gate means.

* * * * *